(12) United States Patent  
Nakayama et al.

(10) Patent No.: US 9,887,111 B2
(45) Date of Patent: Feb. 6, 2018

(54) DIE MOUNTING SYSTEM AND DIE MOUNTING METHOD

(71) Applicant: FUJI MACHINE MFG. CO., LTD., Chiryu (JP)

(72) Inventors: Yukinori Nakayama, Hekinan (JP); Kenji Nakai, Chiryu (JP); Satoshi Yoshioka, Nagoya (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/127,615

(22) PCT Filed: Mar. 24, 2014

(86) PCT No.: PCT/JP2014/058025
§ 371 (c)(1),
(2) Date: Sep. 20, 2016

(87) PCT Pub. No.: WO2015/145530
PCT Pub. Date: Oct. 1, 2015

(65) Prior Publication Data
US 2017/0140960 A1    May 18, 2017

(51) Int. Cl.
*H01L 21/00* (2006.01)
*H01L 21/67* (2006.01)
(Continued)

(52) U.S. Cl.
CPC ........ *H01L 21/67144* (2013.01); *H01L 21/52* (2013.01); *H01L 24/75* (2013.01);
(Continued)

(58) Field of Classification Search
None
See application file for complete search history.

(56) References Cited

U.S. PATENT DOCUMENTS

2012/0104074 A1*  5/2012  Lyu .................. H01L 21/67144
                                                              228/8
2015/0206735 A1   7/2015  Nakayama et al.
(Continued)

FOREIGN PATENT DOCUMENTS

JP    2010-129949 A    6/2010
WO    2014/038053 A1   3/2014

OTHER PUBLICATIONS

International Search Report dated Jun. 10, 2014 in PCT/JP2014/058025 filed Mar. 24, 2014.

*Primary Examiner* — Angel Roman
(74) *Attorney, Agent, or Firm* — Oblon, McClelland, Maier & Neustadt, L.L.P.

(57) ABSTRACT

In a die mounting system in which a die supply device is set on a component mounter and dies supplied from a die supply device are mounted on a circuit board by a mounting head of the component mounter, the position of a die is recognized by processing an image of the die on a dicing sheet captured by a camera, a supply head is moved to a die pickup position by a supply head moving mechanism, the die is picked up, the supply head is vertically inverted and moved to a die transfer position, and the die held by the supply head is picked up by a mounting head of the component mounter at a component transfer position and mounted on the circuit board. The die transfer position is set at a position such that die transfer and die imaging are able to be performed in parallel.

7 Claims, 15 Drawing Sheets

(51) Int. Cl.
  *H01L 23/00* (2006.01)
  *H01L 21/52* (2006.01)
(52) U.S. Cl.
  CPC .............. *H01L 2224/7598* (2013.01); *H01L 2224/75745* (2013.01); *H01L 2224/75753* (2013.01); *H01L 2224/75822* (2013.01)

(56) References Cited

U.S. PATENT DOCUMENTS

2015/0287627 A1\* 10/2015 Yamasaki ......... H01L 21/67144
                                                     294/119.1
2015/0303084 A1\* 10/2015 Iwase ............... H01L 21/67294
                                                     414/331.14

\* cited by examiner

During die pickup operation

During vertical inverting operation

DIE MOUNTING SYSTEM AND DIE MOUNTING METHOD

TECHNICAL FIELD

The present application relates to a die mounting system and die mounting method in which a die supply device that supplies dies formed from a single diced wafer is set on a component mounter, and dies supplied from the die supply device are picked up by a mounting head of the component mounter and mounted on a circuit board.

BACKGROUND ART

In recent years, as disclosed in patent literature 1 (JP-A-2010-129949), there are items in which a die supply device that supplies dies is set on a component mounter, and dies supplied from the die supply device are picked up by a mounting head of the component mounter and mounted on a circuit board. This die supply device is provided with a magazine that houses multiple levels of wafer pallets on which is an expanded dicing sheet affixed with a wafer that has been diced into multiple dies, and a supply head that picks up the dies from the dicing sheet on the wafer pallet, with the configuration being such that wafer pallets are pulled out from the magazine one at a time and dies picked up by the supply head from the dicing sheet on the wafer pallet.

In this case, because the dicing sheet is expanded uniformly in the XY directions in order to create a gap between each die so that pickup becomes easier, the position of each die on the dicing sheet varies based on the expansion amount of the dicing sheet. Due to this, on the die supply device, a camera for performing image recognition of the position of the die is equipped, and before picking up a die from the dicing sheet, a die to be picked up is imaged by the camera from above and the position of the die is recognized, and then die pickup operation is performed.

CITATION LIST

Patent Literature

Patent Literature 1: JP-A-2010-129949

SUMMARY

As described above, dies are formed by dicing a single wafer affixed to a dicing sheet, and there are cases in which the wafer is affixed to the dicing sheet with the mounting surface of the dies facing up. Accordingly, the applicant of the present disclosure is researching and developing a die mounting system configured so as to vertically invert the supply head of the die supply device, and after die pickup operation, to vertically invert the supply head, pick up the die held on the supply head with a mounting head of a component mounter, and mount the die on a circuit board. In this case, die transfer preparation operation (die imaging and image processing, die pickup operation, and supply head vertical inverting operation) of the die supply device is performed after die transfer operation from the supply head of the die supply device to the mounting head of the component mounter. Thus, there are many cases in which the time taken for the supply head of the die supply device to complete die transfer preparation operation and move to the next die transfer position is longer compared to the time taken until the mounting head of the component mounter completes die mounting operation and moves to the next die transfer position, and in these cases, waiting time arises during which the mounting head of the component mounter waits at the die transfer position for completion (arrival of supply head) of die transfer preparation operation by the die supply device, leading to the problem of lost productivity equivalent to that waiting time.

An object of the present disclosure is to provide a die mounting system and die mounting method in which productivity is improved by reducing or making zero the time that the mounting head of a component mounter waits at the die transfer position for the arrival of the supply head of a die supply device.

To solve the above problem, the present disclosure is a die mounting system including: a die supply device that supplies dies formed from a single diced wafer affixed to a dicing sheet and that is set on a component mounter; a mounting head of the component mounter that mounts the die supplied from the die supply device on a circuit board, wherein the die supply device includes a supply head that picks up a die from the dicing sheet and is then vertically inverted, a camera that images the die on the dicing sheet, and a supply head moving mechanism that moves the supply head as one with the camera, wherein the die mounting system is further provided with a control system that controls operation such that an image captured by the camera is processed to recognize a position of a die on the dicing sheet, the supply head is moved above the die by the supply head moving mechanism, the die is picked up by the supply head, the supply head is vertically inverted, the supply head is moved to a die transfer position by the supply head moving mechanism, and the die held by the supply head is picked up by the mounting head of the component mounter at the component transfer position and mounted on the circuit board, wherein the die transfer position is set at a position such that die transfer operation of picking up the die held by the supply head with the mounting head and die imaging operation of imaging a die on the dicing sheet with the camera are able to be performed in parallel.

With the present disclosure, because the camera and the supply head of the die supply device always have a fixed positional relationship, the die transfer position at which die transfer operation of picking up the die held by the supply head of the die supply device with the mounting head of the component mounter is performed is set at a position such that die transfer operation and die imaging operation of imaging a die on the dicing sheet using the camera are able to be performed in parallel, thus die transfer operation at the die transfer position and die imaging operation are performed in parallel. By this, with the present disclosure, compared to a case in which die imaging operation is performed after the completion of die transfer operation, it is possible to make the completion time for die transfer preparation operation (die imaging and image processing, die pickup operation, supply head vertical inverting operation and movement to the die transfer position) of the die supply device faster by the amount that die imaging operation is performed during die transfer operation, thus the waiting time that the mounting head of the component mounter waits at the die transfer position for the completion of die transfer preparation operation of the die supply device (arrival of supply head) is reduced or made zero. This allows transfer of dies from the die supply device to the component mounter to be performed efficiently, thereby improving productivity.

Conventionally, die supply devices have a configuration provided with a magazine that houses multiple levels of wafer pallets on which is an expanded dicing sheet affixed with dies, and a pallet pulling out and returning mechanism that pulls out the wafer pallet from the magazine to a position under the supply head and the camera and returns the wafer pallet to the magazine. With this configuration, because the wafer pallet is able to be moved in a pulling out and returning direction by the pallet pulling out and returning mechanism, the control system may move a die that is to be an imaging target into the field of view of the camera, such that the die can be imaged, by moving the wafer pallet in the Y direction, which is the pulling out and returning direction, using the pallet pulling out and returning mechanism, with the supply head moved to the die transfer position by the supply head moving mechanism. In this manner, even in a case in which the die that is to be an imaging target is not within the field of view of the camera when the supply head of the die supply device is moved to the die transfer position, if there is a die that is to be an imaging target positioned outside the field of view of the camera in the Y direction, the die that is to be the imaging target can be moved into the field of view of the camera by moving the wafer pallet in the Y direction using the pallet pulling out and returning mechanism and then imaged, thus it is possible to perform die transfer operation at the die transfer position and die imaging operation in parallel.

With the present disclosure, only one suction nozzle may be provided on the supply head of the die supply device such that only one die is picked up, or multiple suction nozzles may be provided such that multiple dies are picked up. In a case in which multiple suction nozzles are provided on the supply head, operation may be repeated of moving a single die or a given number of dies which are to be the imaging target within the field of view of the camera by moving the wafer pallet in the Y direction, which is a pulling out and returning direction, using the pallet pulling out and returning mechanism in a state with the supply head moved to the die transfer position by the supply head moving mechanism and then imaging the dies so as to recognize the positions of multiple dies to be picked up by the multiple suction nozzles of the supply head. In this manner, even in a case in which multiple dies are picked up by multiple suction nozzles of the supply head of the die supply device, die transfer operation at the die transfer position and sequential imaging by the camera of multiple dies that are to be the imaging target are able to be performed in parallel.

DESCRIPTION OF EMBODIMENTS

An embodiment of the present disclosure is described below with reference to the drawings.

Figure 1:
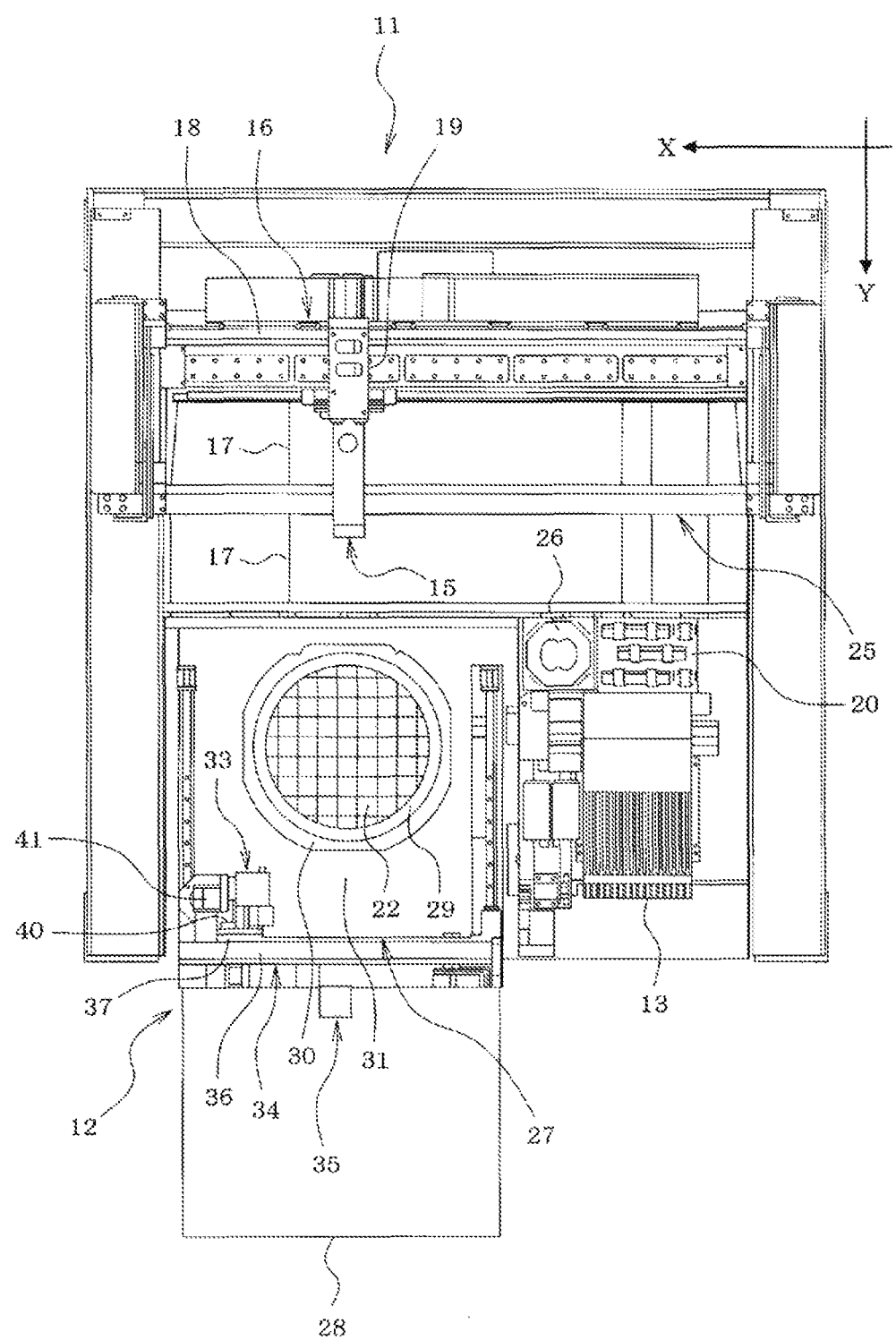
FIG. 1 is a plan view of a die supply device set in a component mounter of an embodiment of the present disclosure.
Figure 2:
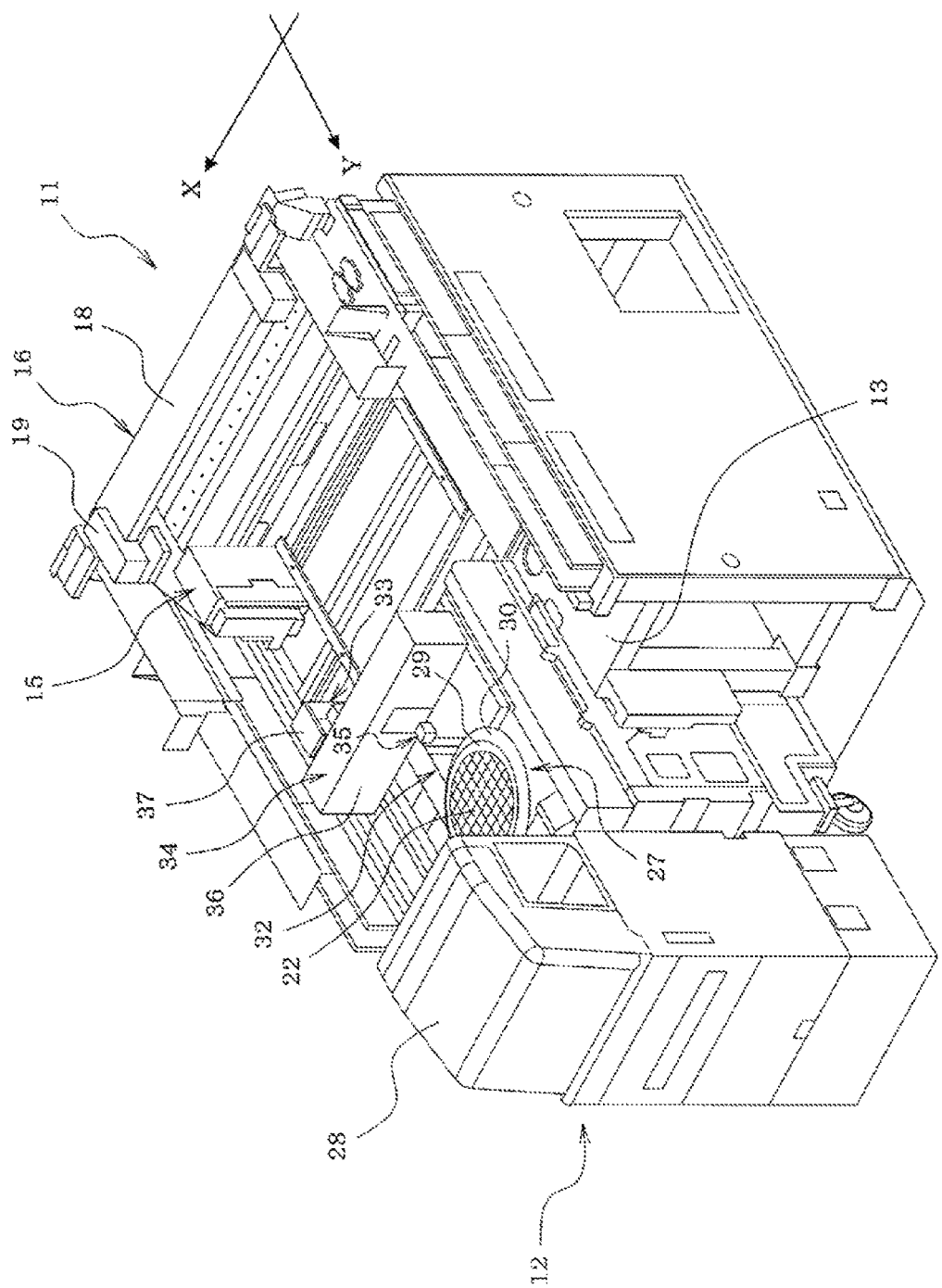
FIG. 2 is a perspective view showing the die supply device set in the component mounter.
Figure 3:
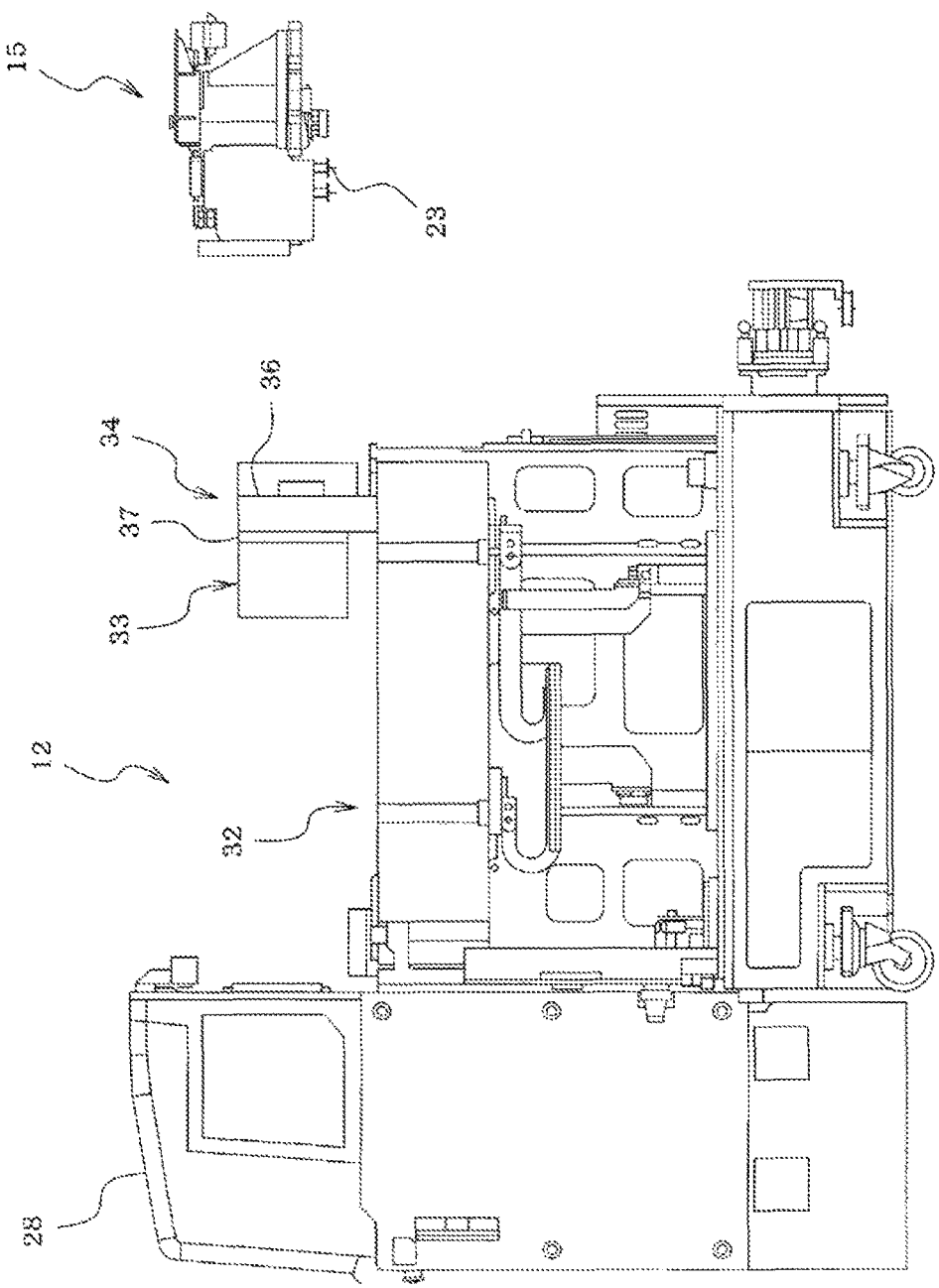
FIG. 3 is a side view showing the positional relationship between the mounting head of the component mounter and the die supply device when the die supply device is set in the component mounter.
Figure 4:
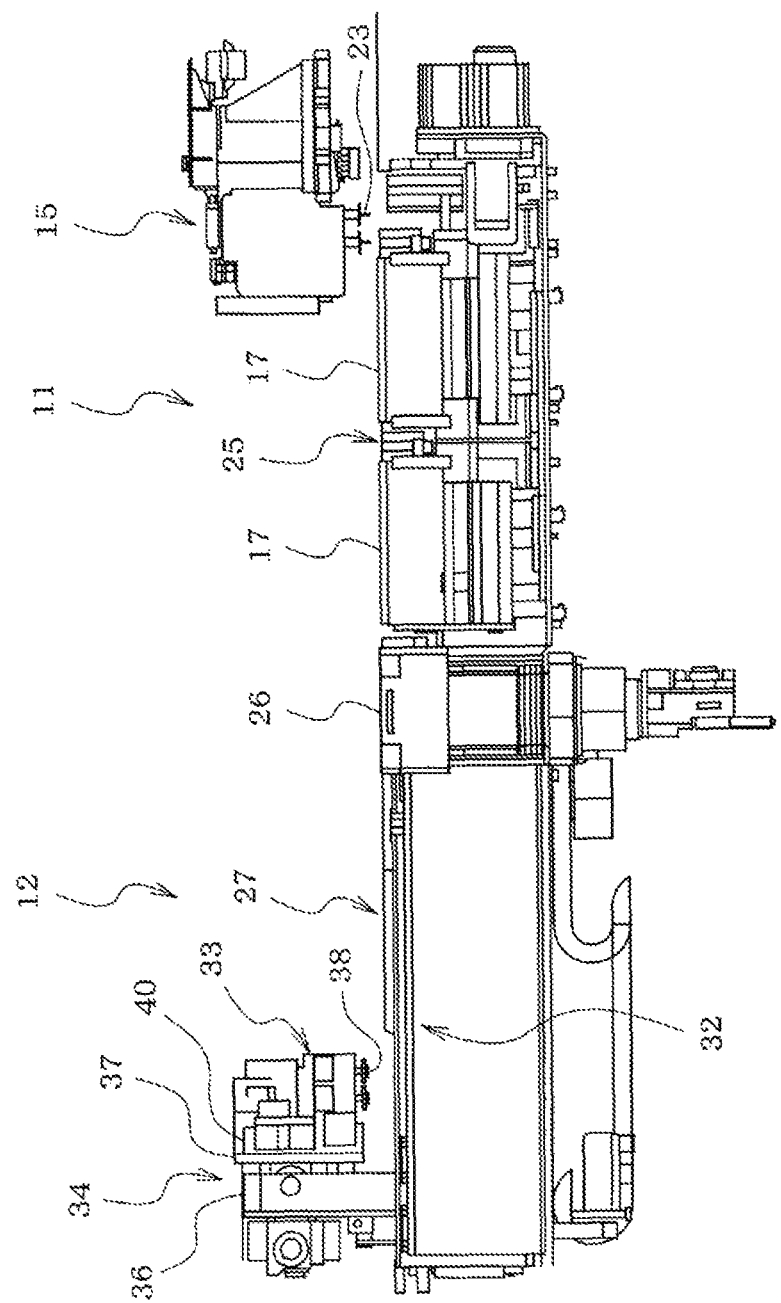
FIG. 4 is a side view showing the height positional relationship between the mounting head of the component mounter and the supply head when the stage of the die supply device is raised.

As shown in FIG. 1 and FIG. 2, die supply device 12 is detachably set in component mounter 11. In component mounter 11, feeder setting table 13 is provided adjacent to a set position of die supply device 12, and a feeder (not shown) such as a tape feeder is detachably set on feeder setting table 13. Feeders set on feeder setting table 13 are not limited to tape feeders; feeder may be a bulk feeder, a stick feeder, and the like, and multiple types of feeders among thereof may be set on feeder setting table 13.

Component mounter 11 is provided with XY moving mechanism 16 (XY robot) that moves mounting head 15 in XY-directions (right-left and front-rear directions). XY moving mechanism 16 includes Y slide 18 that slides in a Y-direction (a direction perpendicular to a conveyance direction of circuit board 17) and X slide 19 that is supported on Y slide 18 so as to be slidable in an X-direction (the conveyance direction of circuit board 17); mounting head 15 is supported on X slide 19.

Mounting head 15 of component mounter 11 is provided with one or multiple suction nozzles 23 (refer to FIGS. 3 to 8) that pick up a die 22 supplied from die supply device 12 or an electronic component (hereinafter referred to as a "feeder component") supplied from a feeder, a mark camera (not shown) that images an imaging target such as a fiducial mark of circuit board 17 from above, and the like. Mounting head 15 is exchangeable with a mounting head having a different number of suction nozzles 23.

Component mounter 11 is provided with two conveyors 25 that convey circuit board 17 lined up next to each other, and part camera 26 (refer to FIG. 1 and FIGS. 4 to 8) that images die 22 or the feeder component which has been picked up by suction nozzle 23 of mounting head 15 from below is provided facing upward at a position between conveyors 25 and die supply device 12 (or the feeder). Also, nozzle station 20 (refer to FIG. 1) that stores suction nozzles for exchange is provided on component mounter 11, such that a suction nozzle 23 held on mounting head 15 can be automatically exchanged with a suction nozzle stored in nozzle station 20.

Figure 12:
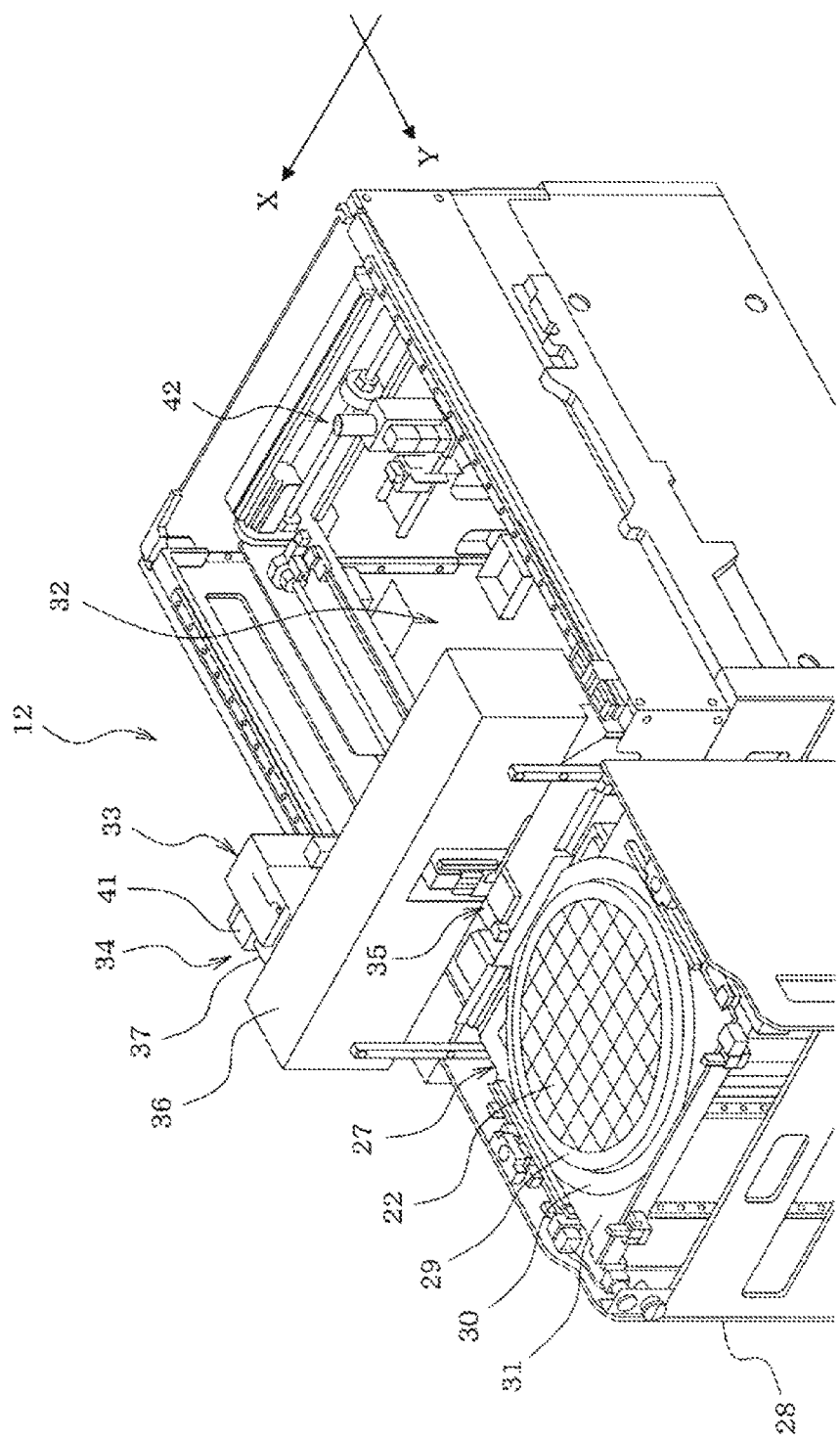
FIG. 12 is a perspective view from diagonally above showing the state in which a wafer pallet has not been pulled out from the magazine of the die supply device onto the stage.
Figure 13:
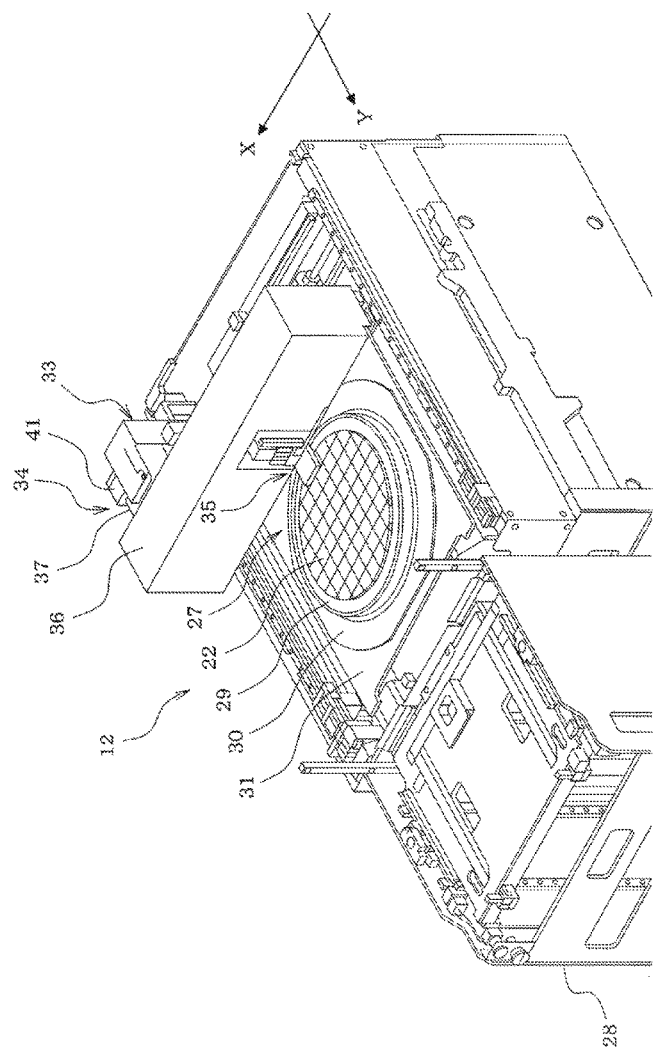
FIG. 13 is a perspective view from diagonally above showing the state in which a wafer pallet has been pulled out from the magazine of the die supply device onto the stage.

Meanwhile, die supply device 12 is provided with magazine 28 that houses wafer pallets 27 at multiple levels. As shown in FIG. 12 and FIG. 13, wafer pallet 27 is configured such that elastic dicing sheet 29 attached with a wafer diced so as to be divided into many dies 22 is mounted in an expanded state on dicing frame 30 that has a circular opening portion, and dicing frame 30 is attached to pallet main body 31 by screw clamps or the like. Pallet pulling out and returning mechanism 35 is provided on die supply device 12, and wafer pallet 27 is pulled out onto stage 32 and returned into magazine 28 by pallet pulling out and returning mechanism 35.

Figure 9:
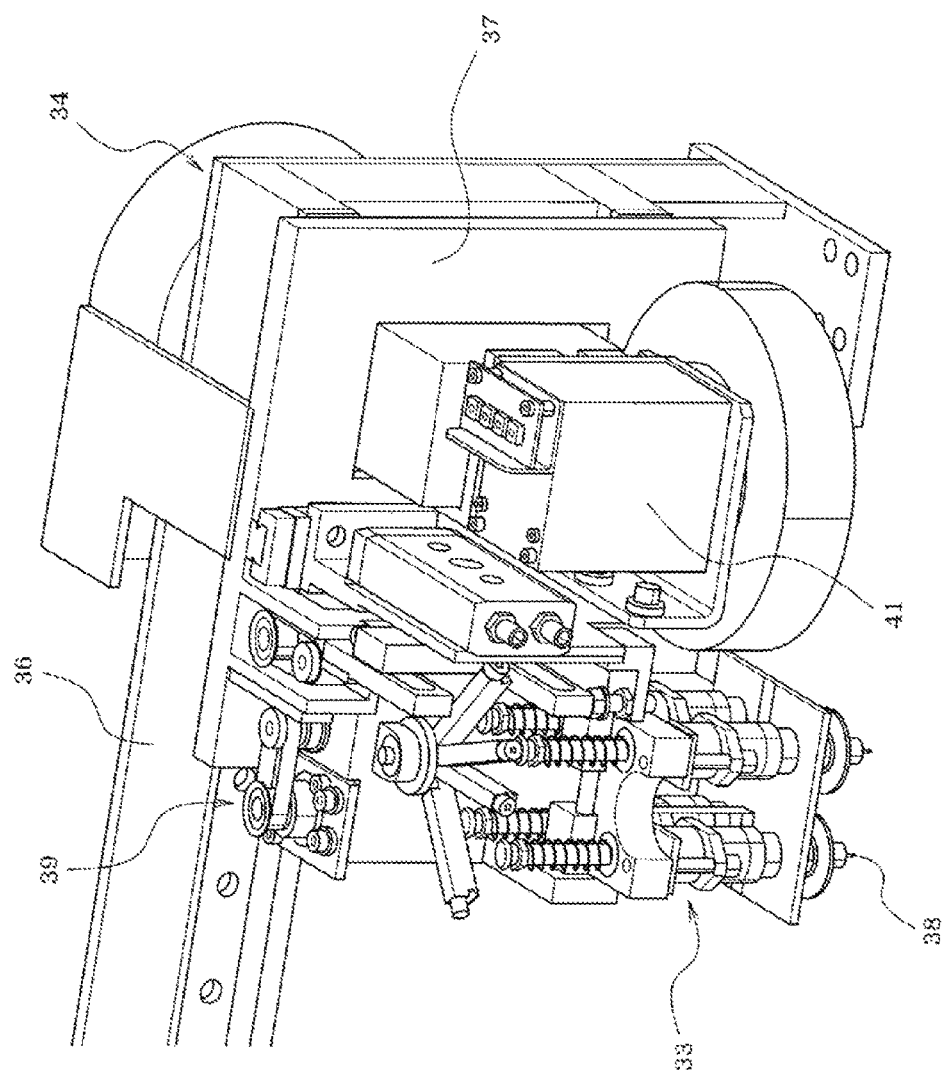
FIG. 9 is a perspective view showing the positional relationship of the camera and the supply head of the die supply device.
Figure 10:
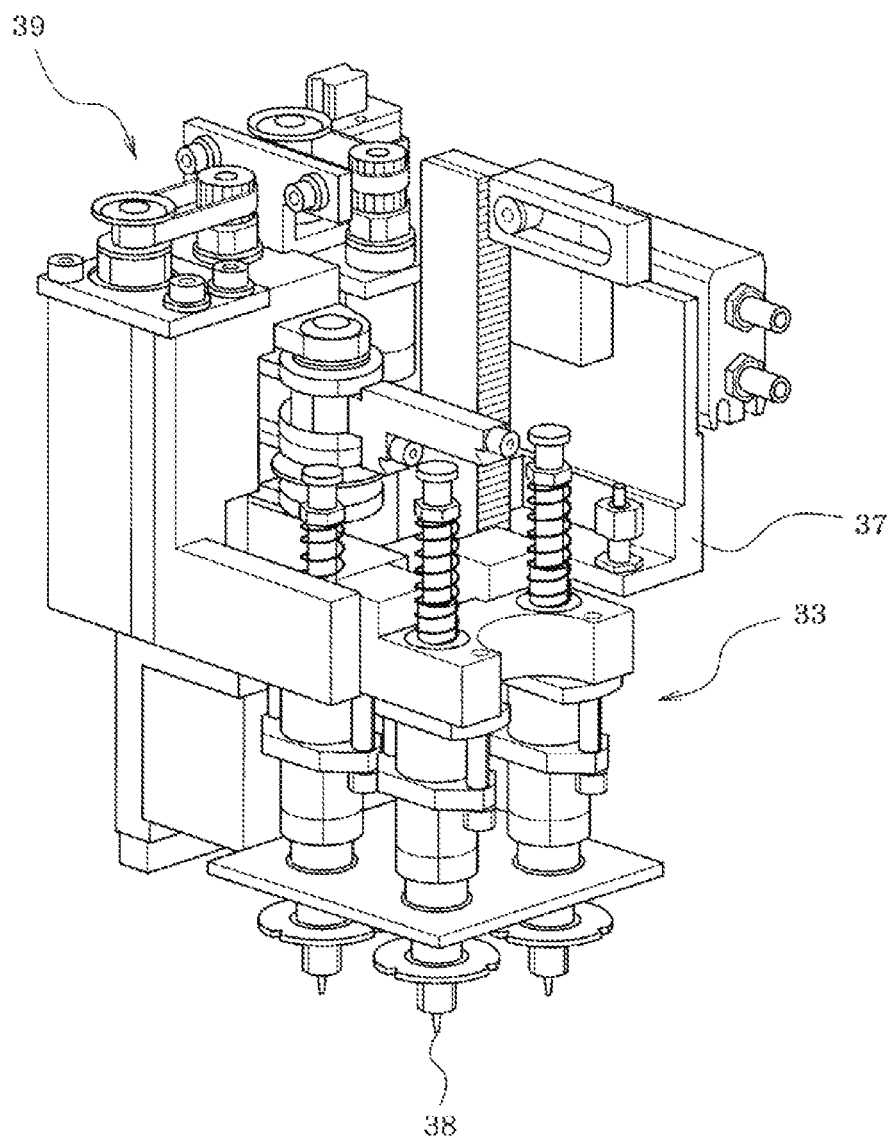
FIG. 10 is a perspective view showing the state of the supply head during die pickup operation.
Figure 11:
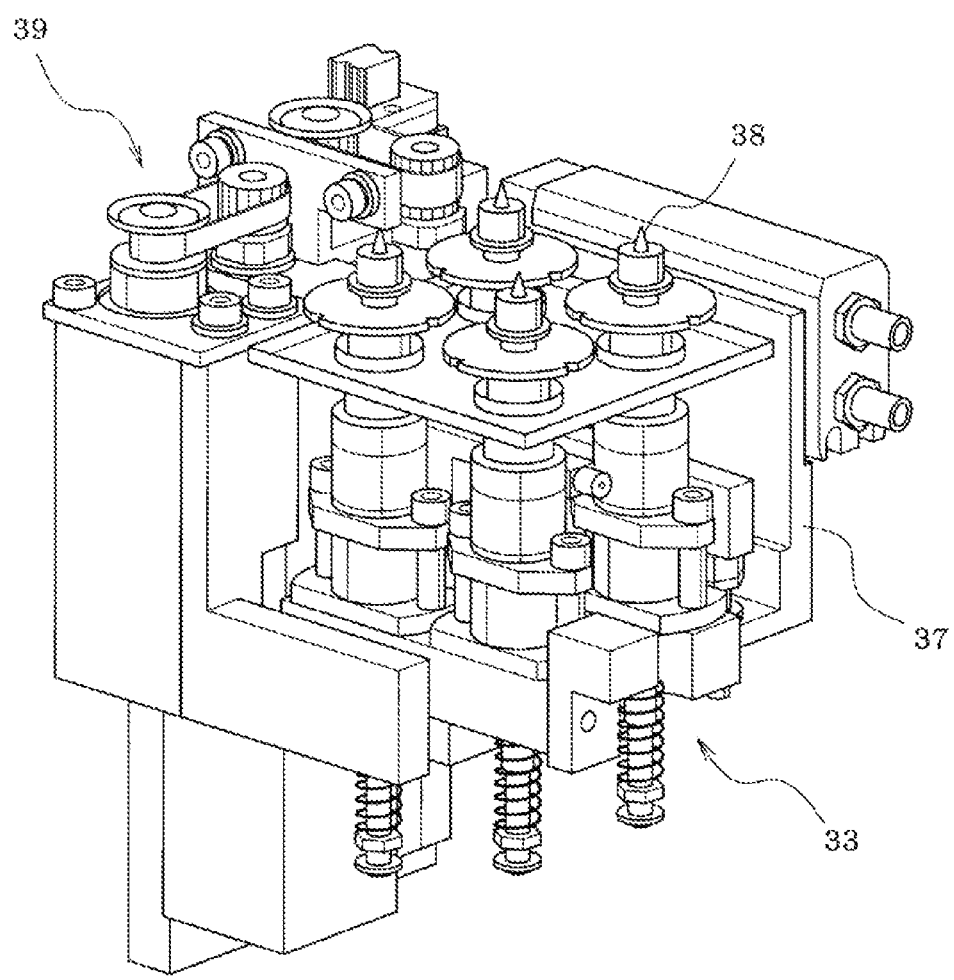
FIG. 11 is a perspective view showing the state of the supply head during vertical inverting operation.

Also, die supply device 12 is provided with supply head moving mechanism 34 (XY robot) that moves supply head 33 in the XY-directions (the right-left and front-rear directions). Supply head moving mechanism 34 includes Y slide 36 that slides in the Y-direction, and X slide 37 that is supported on Y slide 36 so as to be slidable in the X-direction; supply head 33 is detachably held by head holding unit 40 that is provided on X slide 37; one or multiple suction nozzles 38 (refer to FIGS. 9 to 11) are held by supply head 33 so as to be vertically movable. Supply head 33 of die supply device 12 is used when die 22 is attached on dicing sheet 29 of wafer pallet 27 with the mounting surface facing upward and is configured such that, after die 22 has been picked up by suction nozzle 38 of the supply head 33, the supply head 33 is inverted by vertical inverting mechanism 39 (refer to FIGS. 9 to 11), thereby flipping die 22 so as to be picked up by suction nozzle 23 of mounting head 15 of component mounter 11.

Figure 7:
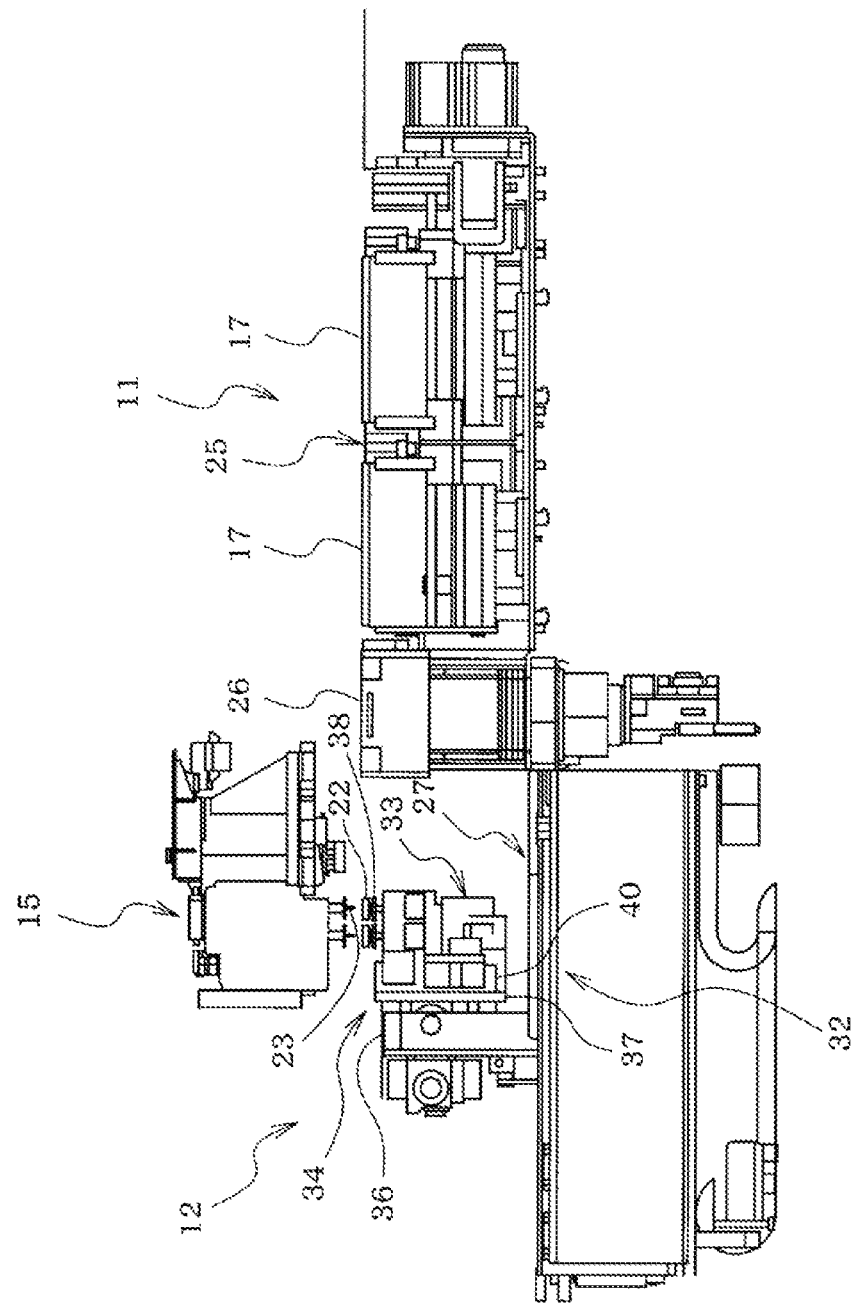
FIG. 7 is a side view showing the state when dies held by the supply head that has been vertically inverted are picked up by the mounting head of the component mounter.

In this case, since the height position of die 22 on the inverted supply head 33 must be adjusted to the pickup height position of mounting head 15 of component mounter 11, an up-down moving mechanism (not shown) which moves supply head 33 of die supply device 12 up and down integrally with stage 32 on which wafer pallet 27 is set is provided, and in cases in which die 22 is inverted and then mounted on circuit board 17, as shown in FIG. 7, die 22 on inverted supply head 33 is picked up by mounting head 15 of component mounter 11 at a position in which supply head 33 and stage 32 have been lowered by the up-down moving mechanism.

Figure 8:
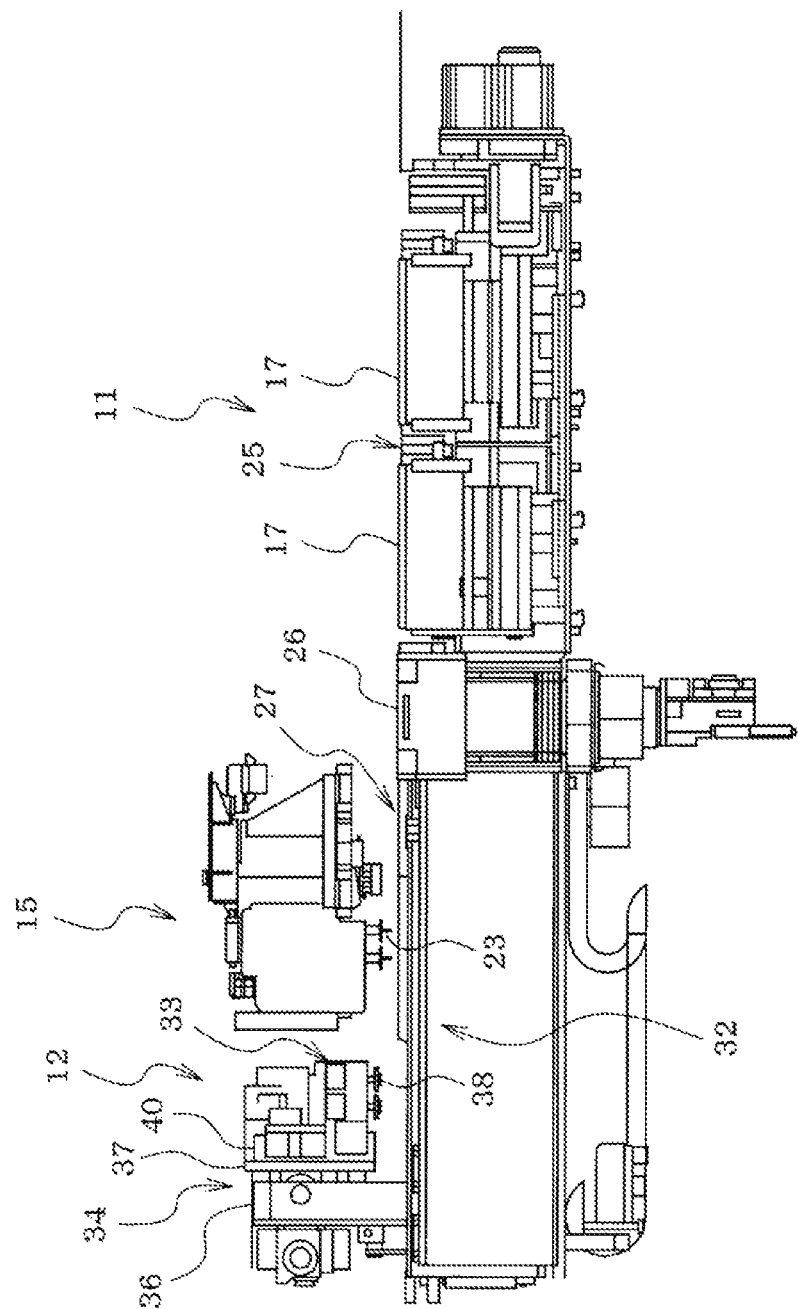
FIG. 8 is a side view showing the state when the mounting head of the component mounter directly picks up dies from a wafer pallet on the stage of the die supply device.

Meanwhile, when die 22 is attached on dicing sheet 29 of wafer pallet 27 with the mounting surface facing downward, die 22 is mounted on circuit board 17 without being vertically inverted. In this case, as shown in FIG. 8, die 22 of wafer pallet 27 on stage 32 is picked up by suction nozzle 23 of mounting head 15 of component mounter 11 at a position in which supply head 33 and stage 32 have been raised by the up-down moving mechanism.

Supply head 33 of die supply device 12 is provided with camera 41 (refer to FIG. 9) that images die 22 before the die 22 is picked up by suction nozzle 38 of supply head 33; an image captured by camera 41 is processed to recognize the position of die 22, and then die 22 is picked up by suction nozzle 38 of supply head 33.

Also, die supply device 12 is provided with pushup mechanism 42 (refer to FIG. 12) that pushes up a portion of dicing sheet 29 that is to be picked up by suction nozzle 38 from below when die 22 is picked up by suction nozzle 38 of supply head 33. Pushup mechanism 42 moves up and down in association with the up-down movement of stage 32.

While component mounter 11 is operating, a control system (not shown) controls operations of component mounter 11, die supply device 12, and the feeder in accordance with a production job (a production program) such that any one of dies 22 supplied from die supply device 12 and the feeder components supplied from the feeder is picked up and mounted on circuit board 17.

Figure 5:
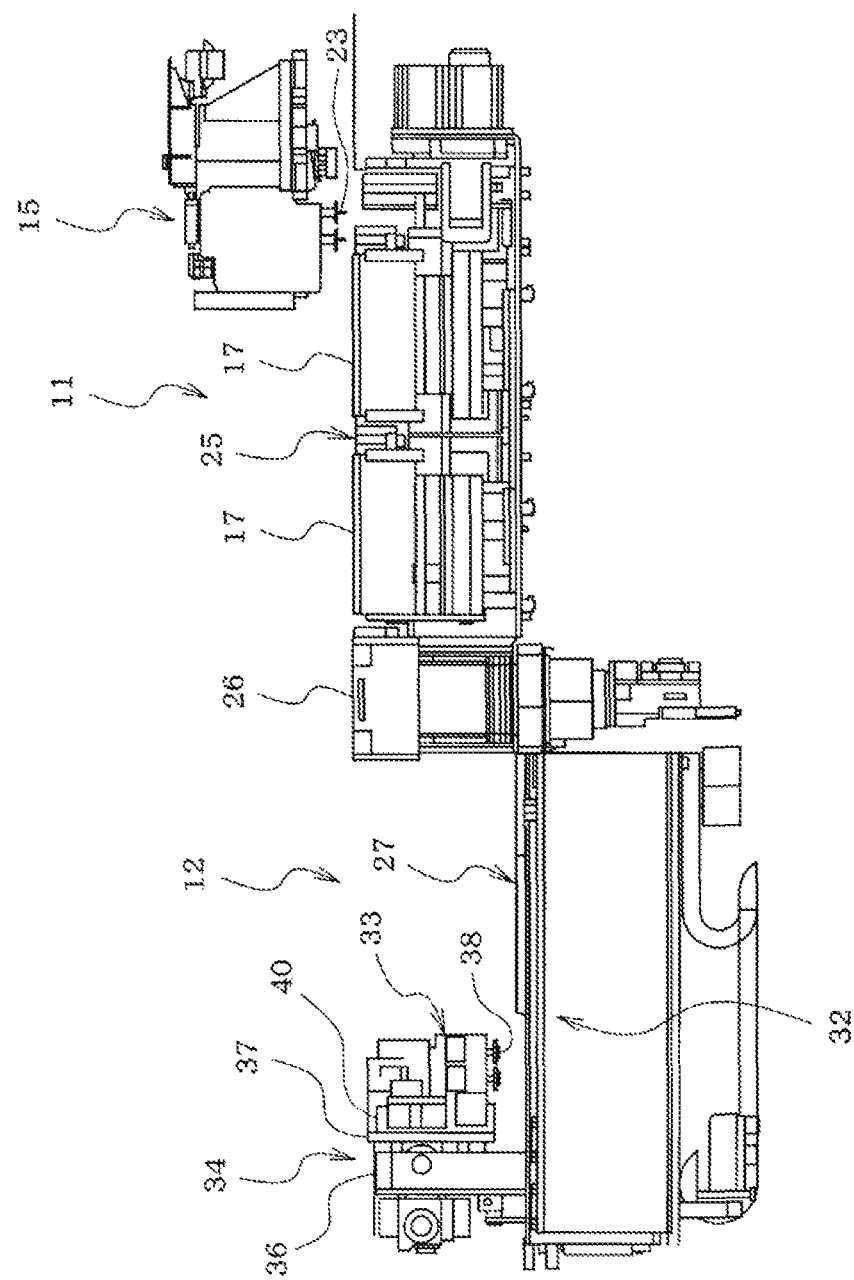
FIG. 5 is a side view showing the height positional relationship between the mounting head of the component mounter and the supply head when the stage of the die supply device is lowered.
Figure 6:
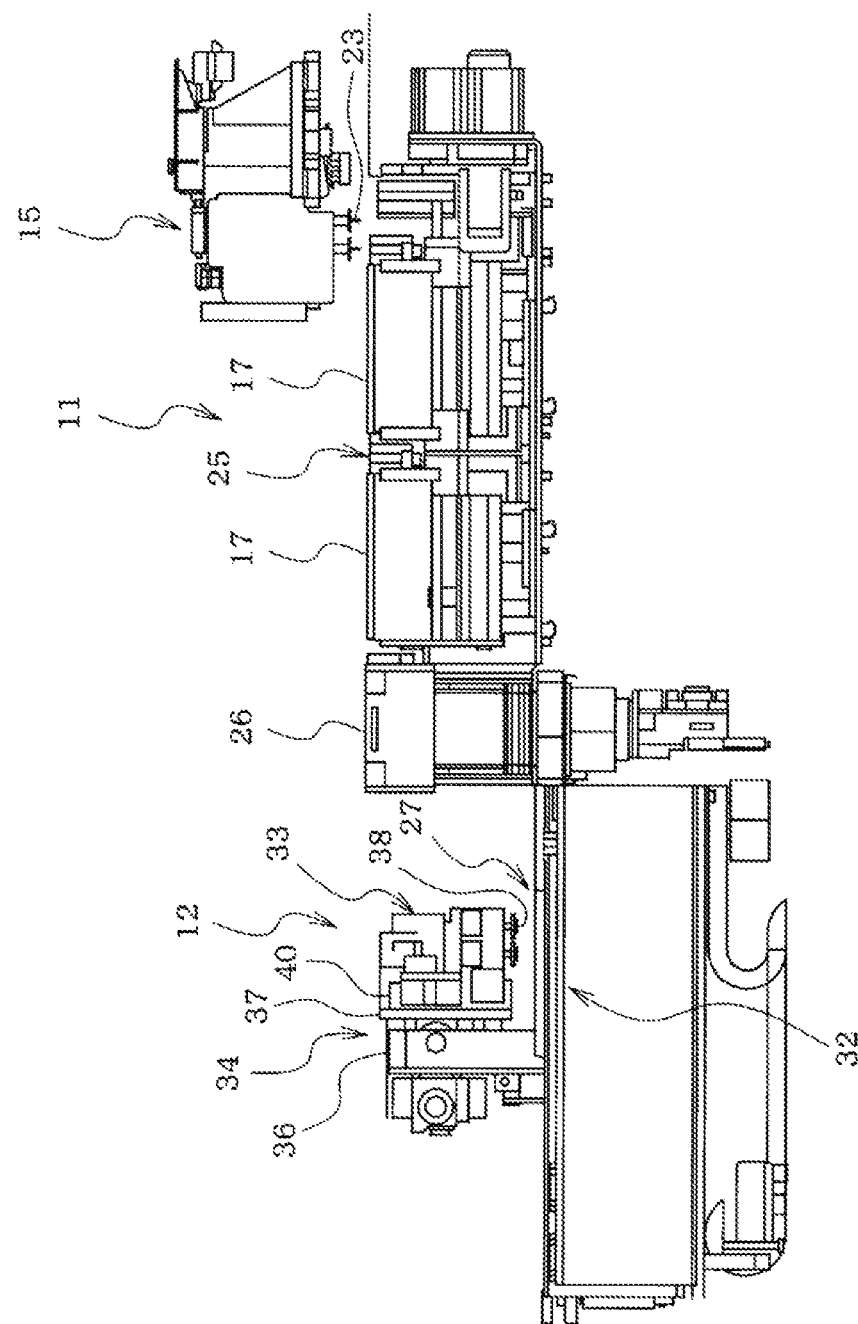
FIG. 6 is a side view showing the state when dies on a wafer pallet on the stage of the die supply device are picked up by the supply head.

Here, in a case in which die 22 is vertically inverted and then mounted on circuit board 17, as shown in FIG. 5, stage 32 and supply head 33 of die supply device 12 are lowered, and, as shown in FIG. 6, supply head 33 is moved above wafer pallet 27, and die 22 is picked up by suction nozzle 38 of supply head 33. Next, as shown in FIG. 7, supply head 33 of die supply device 12 is inverted together with suction nozzle 38 such that die 22 held by suction nozzle 38 is inverted, mounting head 15 of component mounter 11 is moved to be positioned above supply head 33, then, the die 22 on suction nozzle 38 of supply head 33 is picked up by suction nozzle 23 of mounting head 15 and is mounted on circuit board 17.

In this case, because dicing sheet 29 affixed with dies 22 is expanded uniformly in the XY directions in order to create a gap between each die so that pickup of dies 22 becomes easier, the position of each die 22 on dicing sheet 29 varies based on the expansion amount of dicing sheet 29. Therefore, before picking up die 22 on dicing sheet 29, it is necessary to image the die 22 that is to be the pickup target from above using camera 41 so as to recognize the position of the die 22.

Also, if die transfer preparation operation (die 11 imaging and image processing, die pickup operation, and supply head 33 vertical inverting operation and moving to the die transfer position) of die supply device 12 is to be performed after completion of die transfer operation of transferring the die from supply head 33 of die supply device 12 to mounting head 15 of component mounter 11, there are more cases in which the time taken for supply head 33 of die supply device 12 to complete die transfer preparation operation and move to the next die transfer position is longer compared to the time taken until mounting head 15 of component mounter 11 completes die mounting operation and moves to the next die transfer position. Thus, waiting time arises during which mounting head 15 of component mounter 11 waits at the die transfer position for completion (arrival of supply head 33) of die transfer preparation operation by die supply device 12, leading to the problem of lost productivity equivalent to that waiting time.

In contrast, with the present embodiment, because camera 41 and supply head 33 of die supply device 12 always have a fixed positional relationship, the die transfer position at which a die is transferred from supply head 33 of die supply device 12 to mounting head 15 of component mounter 11 is set at a position such that die transfer operation of picking up die 22 held on supply head 33 by mounting head 15 and die imaging operation of imaging die 22 on dicing sheet 29 using camera 41 are able to be performed in parallel, thus the configuration is such that die transfer operation at the die transfer position and die imaging operation are able to be performed in parallel.

Figure 15:
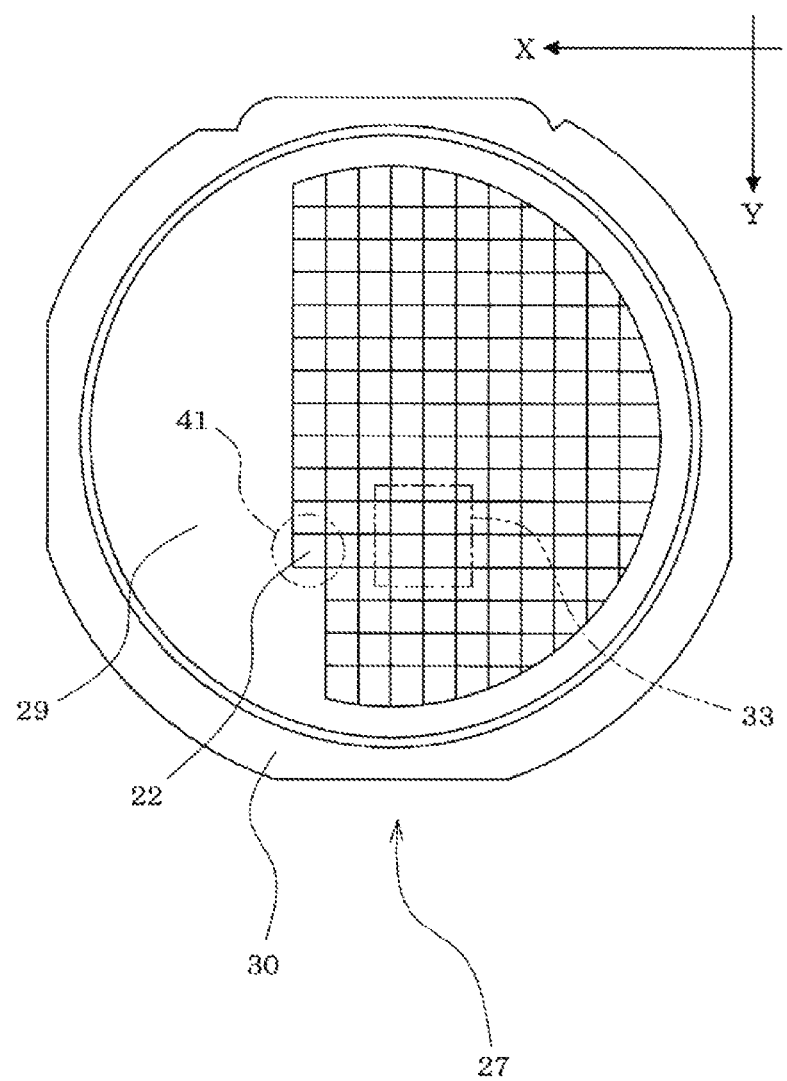
FIG. 15 is a plan view showing the positional relationship of the camera and the supply head during die transfer operation.

Also, with the present embodiment, because wafer pallet 27 is able to be moved in the Y direction, which is a pulling out and returning direction, by pallet pulling out and returning mechanism 35, as shown in FIG. 15, die 22 that is to be an imaging target is able to be moved in the field of view of camera 41, such that die 22 can be imaged, by moving wafer pallet 27 in the Y direction, which is the pulling out and returning direction, using pallet pulling out and returning mechanism 35, with supply head 33 moved to the die transfer position by supply head moving mechanism 34. In this manner, even in a case in which die 22 that is to be an imaging target is not within the field of view of camera 41 when supply head 33 of die supply device 12 is moved to the die transfer position, if there is a die 22 that is to be an imaging target positioned outside the field of view of camera 41 in the Y direction, the die 22 that is to be the imaging target can be moved into the field of view of camera 41 by moving wafer pallet 27 in the Y direction using pallet pulling out and returning mechanism 35 and then imaged, thus it is possible to perform die transfer operation at the die transfer position and die imaging operation in parallel.

Further, with the present embodiment, because multiple suction nozzles 38 are provided on supply head 33 of die supply device 12 such that multiple dies 22 can be picked up, operation is repeated of moving a single die 22 or a given number of dies 22 which are to be the imaging target within the field of view of camera 41 by moving wafer pallet 27 in the Y direction, which is a pulling out and returning direction, using pallet pulling out and returning mechanism 35 in a state with supply head 33 moved to the die transfer position by supply head moving mechanism 34 and then imaging the dies 22 and performing image processing so as to recognize the positions of the multiple dies 22 to be picked up by the multiple suction nozzles 38 of supply head 33. In this manner, even in a case in which multiple dies 22 are picked up by multiple suction nozzles 38 of supply head 33 of die supply device 12, die transfer operation at the die transfer position and sequential imaging by camera 41 of multiple dies 22 that are to be the imaging target are able to be performed in parallel.

Note that, with the present embodiment, the quantity and arrangement of suction nozzles 23 of mounting head 15 of component mounter 11 are the same as the quantity and arrangement of suction nozzles 38 of supply head 33 of die supply device 12, such that multiple dies 22 picked up by multiple suction nozzles 38 of supply head 33 of die supply device 12 can be transferred to multiple suction nozzles 23 of mounting head 15 of component mounter 11 at the same time.

However, the present disclosure may have a configuration in which the quantity of suction nozzles 23 of mounting head 15 of component mounter 11 is different to the quantity of suction nozzles 38 of supply head 33 of die supply device 12, for example, in a case in which the quantity of suction nozzles 23 of mounting head 15 of component mounter 11 is fewer than the quantity of suction nozzles 38 of supply head 33 of die supply device 12, mounting head 15 of component mounter 11 may be moved repeatedly to and from the die transfer position and the die mounting position on circuit board 17 with supply head 33 of die supply device 12 moved to the die transfer position, until all of the dies 22 held on the supply head 33 have been used. Also, in a case in which the quantity of suction nozzles 23 of mounting head 15 of component mounter 11 is greater than the quantity of suction nozzles 38 of supply head 33 of die supply device 12, supply head 33 of die supply device 12 may be moved repeatedly to and from the die transfer position and the die pickup position with mounting head 15 of component mounter 11 moved to the die transfer position, until a die 22 has been picked up by all of the suction nozzles 23 of mounting head 15.

Figure 14A:
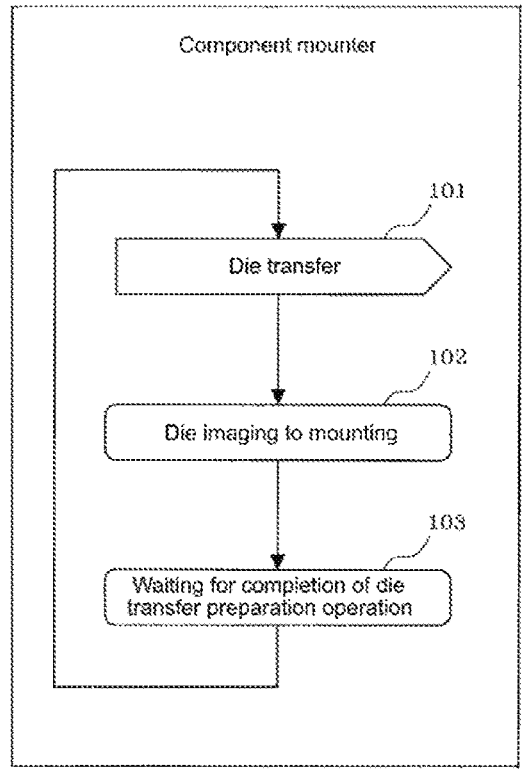
FIG. 14A is a flow chart showing the operation flow of the die supply device.
Figure 14B:
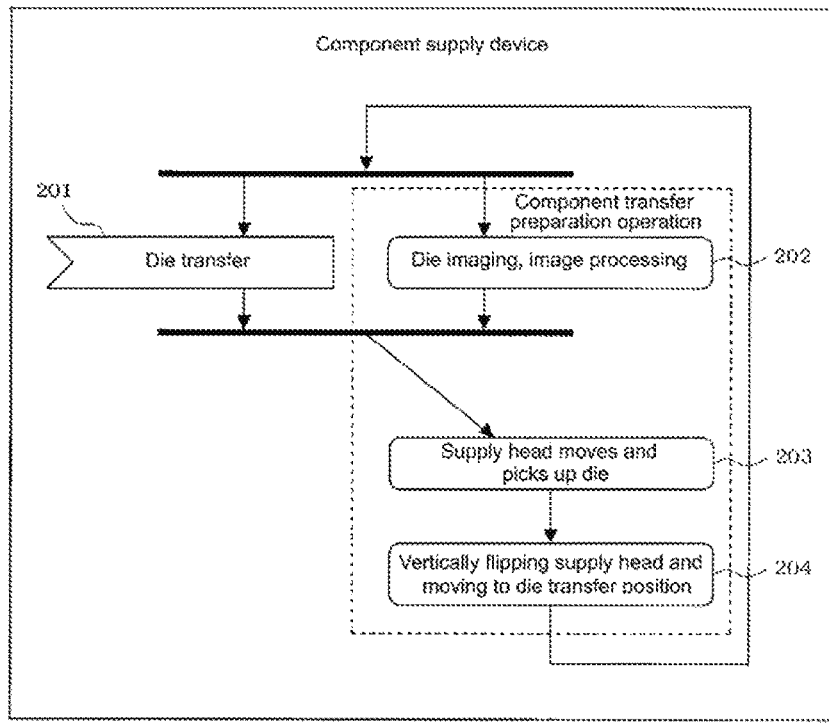
FIG. 14B is a flow chart showing the operation flow of the component mounter.

Die transfer preparation operation (die 11 imaging and image processing, die pickup operation, and supply head 33 vertical inverting operation and movement to the die transfer position) of die supply device 12 and die transfer operation of transferring dies from supply head 33 of die supply device 12 to mounting head 15 of component mounter 11 as described in the above embodiment are performed by a control system (a control device of die supply device 12 and a control device of component mounter 11) according to control programs shown in FIGS. 14A and 14B.

The control device of component mounter 11, in step 101, performs die transfer operation of picking up die 22 held by supply head 33 of die supply device 12 with suction nozzle 23 of mounting head 15 of component mounter 11 at the die transfer position, then, continuing to step 102, moves mounting head 15 above part camera 26 such that die 22 held by suction nozzle 23 of mounting head 15 is within the field of view of part camera 26, images die 22, and recognizes the orientation of die 22 (pickup position deviation, angle deviation, and so on) by image processing the image, then moves mounting head 15 above circuit board 17 and mounts die 22 held by suction nozzle 23 of mounting head 15 onto circuit board 17. Here, die 22 is mounted onto circuit board 17 after correcting for the pickup position deviation and angle deviation and so on of die 22 with respect to suction nozzle 23 based on the image recognition results of the pickup orientation of die 22. Then, continuing to step 103, mounting head 15 of component mounter 11 is returned to the die transfer position to wait for the completion of die transfer preparation operation (die 11 imaging and image processing, die pickup operation, supply head 33 vertical inverting operation and movement to the die transfer position) of die supply device 12. Subsequently, operations of the above steps 101 to 103 are repeated.

On the other hand, the control device of die supply device 12, in step 201, in parallel with performing die transfer operation of picking up die 22 held by supply head 33 of die supply device 12 with suction nozzle 23 of mounting head 15 of component mounter 11 at the die transfer position, in step 202, performs die imaging and image processing of repeatedly moving a single die 22 or a given number of dies 22 which are to be the imaging target within the field of view of camera 41 by moving wafer pallet 27 in the Y direction, which is a pulling out and returning direction, using pallet pulling out and returning mechanism 35 and then imaging the dies 22 and performing image processing so as to recognize the positions of the multiple dies 22 to be picked up by the multiple suction nozzles 38 of supply head 33.

Then, continuing to step 203, supply head 33 of die supply device 12 is moved to the die pickup position by supply head moving mechanism 34 and die 22 is picked up based on the image recognition results of the position of die 22. Then, continuing to step 204, supply head 33 of die supply device 12 is vertically inverted and moved to the die transfer position. Subsequently, operations of the above steps 201 to 204 are repeated.

With the embodiment described above, the die transfer position at which die transfer operation of picking up die 22 held by supply head 33 of die supply device 12 with mounting head 15 of component mounter 11 is performed is set at a position such that die transfer operation and die imaging operation of imaging die 22 on dicing sheet 29 using camera 41 are able to be performed in parallel, thus die transfer operation at the die transfer position and die imaging operation are performed in parallel. By this, with the present embodiment, compared to a case in which die imaging operation is performed after the completion of die transfer operation, it is possible to make the completion time for die transfer preparation operation (die 22 imaging and image processing, die pickup operation, supply head 33 vertical inverting operation and movement to the die transfer position) of die supply device 12 faster by the amount that die imaging operation is performed during die transfer operation, thus the waiting time that mounting head 15 of component mounter 11 waits at the die transfer position for the completion of die transfer preparation operation of die supply device 12 (arrival of supply head 33) is reduced or made zero. This allows transfer of dies from die supply device 12 to component mounter 11 to be performed efficiently, thereby improving productivity.

Note that, the present disclosure is not limited to the embodiment described above and it goes without saying that various embodiments with changes that do not extend beyond the scope of the disclosure are possible, such as that only a single suction nozzle 38 may be provided on supply head 33 of die supply device 12 such that only a single die 22 is picked up, and suitable changes may be made to the configuration of component mounter 11 or die supply device 12.

REFERENCE SIGNS LIST

11: component mounter; 12: die supply device; 13: feeder setting table; 15: mounting head; 16: XY moving mechanism; 17: circuit board; 22: die; 23: suction nozzle; 25: conveyor; 26: part camera; 27: wafer pallet; 28: magazine; 29: dicing sheet; 32: stage; 33: supply head; 34: supply head moving mechanism; 35: pallet pulling out and returning mechanism; 38: suction nozzle; 39: vertical inverting mechanism; 40: head holding unit; 41: camera; 42: pushup mechanism

The invention claimed is:

1. A die mounting system comprising:
a die supply device that supplies dies formed from a single diced wafer affixed to a dicing sheet and that is set on a component mounter; and
a mounting head of the component mounter that picks up a die supplied from the die supply device and mounts the die on a circuit board, wherein
the die supply device includes
a supply head that picks up a die from the dicing sheet and is then vertically inverted,
a camera that images the die on the dicing sheet, and
a supply head moving mechanism that moves the supply head as one with the camera,
the die mounting system is further provided with a control system that controls operation such that an image captured by the camera is processed to recognize a position of a die on the dicing sheet, the supply head is moved above the die by the supply head moving mechanism, the die is picked up by the supply head, the supply head is vertically inverted, the supply head is moved to a die transfer position by the supply head moving mechanism, and the die held by the supply head is picked up by the mounting head of the component mounter at the component transfer position and mounted on the circuit board, and
the die transfer position is set at a position such that die transfer operation of picking up a die held by the supply head with the mounting head and die imaging operation of imaging the die on the dicing sheet with the camera are performed in parallel.

2. The die mounting system according to claim 1, wherein
the die supply device is provided with a magazine that houses multiple levels of wafer pallets on which is an expanded dicing sheet affixed with the dies, and a pallet pulling out and returning mechanism that pulls out the wafer pallet from the magazine to a position under the supply head and the camera and returns the wafer pallet to the magazine, and
the control system moves a die which is an imaging target within a field of view of the camera by moving the wafer pallet in a pulling out and returning direction using the pallet pulling out and returning mechanism in a state with the supply head moved to the die transfer position by the supply head moving mechanism.

3. The die mounting system according to claim 2, wherein
the supply head is provided with multiple nozzles that pick up multiple dies, and
the control system repeats operation of moving a single die or a given number of dies which are to be the imaging target within the field of view of the camera by moving the wafer pallet in a pulling out and returning direction using the pallet pulling out and returning mechanism in a state with the supply head moved to the die transfer position by the supply head moving mechanism and then imaging the dies so as to recognize the positions of multiple dies to be picked up by the multiple nozzles of the supply head.

4. A die mounting method including
a die supply device that supplies dies formed from a single diced wafer affixed to a dicing sheet and that is set on a component mounter, and
a mounting head of the component mounter that picks up a die supplied from the die supply device and mounts the die on a circuit board, wherein
the die supply device includes
a supply head that picks up a die from the dicing sheet and is then vertically inverted,
a camera that images the die on the dicing sheet, and
a supply head moving mechanism that moves the supply head as one with the camera,
the die mounting method comprises:
a step of controlling operation such that an image captured by the camera is processed to recognize a position of a die on the dicing sheet, the supply head is moved above the die by the supply head moving mechanism, the die is picked up by the supply head, the supply head is vertically inverted, the supply head is moved to a die transfer position by the supply head moving mechanism, and the die held by the supply head is picked up by the mounting head of the component mounter at the component transfer position and mounted on the circuit board, and
the die transfer position is set at a position such that die transfer operation of picking up a die held by the supply head with the mounting head and die imaging operation of imaging the die on the dicing sheet with the camera are performed in parallel.

5. The die mounting method according to claim 4, wherein
the die supply device is provided with a magazine that houses multiple levels of wafer pallets on which is an expanded dicing sheet affixed with the dies, and a pallet pulling out and returning mechanism that pulls out the wafer pallet from the magazine to a position under the supply head and the camera and returns the wafer pallet to the magazine, and the die mounting method includes a step of moving the die which is an imaging target within the field of view of the camera by moving the wafer pallet in a pulling out and returning direction using the pallet pulling out and returning mechanism in a state with the supply head moved to the die transfer position by the supply head moving mechanism.

6. The die mounting system according to claim 1, wherein the die transfer position is set at a position at which the camera images a next die to be picked up on the dicing sheet.

7. The die mounting method according to claim 4, wherein the die transfer position is set at a position at which the camera images a next die to be picked up on the dicing sheet.

\* \* \* \* \*